(12) United States Patent
Ito et al.

(10) Patent No.: US 6,444,406 B1
(45) Date of Patent: Sep. 3, 2002

(54) METHOD FOR FORMING PHOTORESIST PATTERN AND MANUFACTURING METHOD OF MAGNETORESISTIVE EFFECT THIN-FILM MAGNETIC HEAD

(75) Inventors: Noriyuki Ito; Koichi Terunuma; Satoshi Tsukiyama, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/899,203

(22) Filed: Jul. 6, 2001

(30) Foreign Application Priority Data

Jul. 11, 2000 (JP) ........................................ 2000-209911

(51) Int. Cl.[7] .................................................. G11B 5/39
(52) U.S. Cl. ........................ 430/320; 430/314; 430/315; 430/319; 430/322; 29/603.07; 29/603.16
(58) Field of Search ................................. 430/319, 320, 430/312, 315, 314, 322; 29/603.07, 603.16

(56) References Cited

U.S. PATENT DOCUMENTS 6,067,703 A * 5/2000 Takahashi et al.
6,141,190 A 10/2000 Nakamoto et al.

FOREIGN PATENT DOCUMENTS

| JP | 11-31313 | 2/1999 |
| JP | 11-224411 | 8/1999 |
| JP | 2000-76629 | 3/2000 |

OTHER PUBLICATIONS

Research Disclosure, "Submicron Photolithography", 26875 (Aug. 1986).*

* cited by examiner

*Primary Examiner*—John A. McPherson
(74) *Attorney, Agent, or Firm*—Burns, Doane, Swecker & Mathis, L.L.P.

(57) ABSTRACT

A method for forming a photoresist pattern, includes a step of forming a photoresist pattern having a certain width, and a step of performing thereafter ion milling with respect to side walls of the formed photoresist pattern by using an ion beam with a large incident angle so as to reduce the width of the formed photoresist pattern.

5 Claims, 3 Drawing Sheets

AMOUNT OF OVERLAP

AMOUNT OF OVERLAP

METHOD FOR FORMING PHOTORESIST PATTERN AND MANUFACTURING METHOD OF MAGNETORESISTIVE EFFECT THIN-FILM MAGNETIC HEAD

FIELD OF THE INVENTION

The present invention relates to a method for forming a photoresist pattern and a manufacturing method of a magnetoresistive effect (MR) thin-film magnetic head provided with an anisotropic magnetoresistive effect (AMR) element, or with a giant magnetoresistive effect (GMR) element such as a spin-valve magnetoresistive effect (SVMR) element.

DESCRIPTION OF THE RELATED ART

Such MR element in general has a sensor layer operating as a sensor (an MR layer in the AMR element, a ferromagnetic free layer in the GMR element for example), two magnetic domain control layers for applying a longitudinal bias to the sensor layer in order to make this layer in a single domain state, and two lead conductor layers laminated on the domain control layers. Both the magnetic domain control layers and the lead conductor layers are contacted with side end faces of the sensor layer.

These magnetic domain control layers and the lead conductor layers laminated each other are in general separated to have the same space between them along the track width direction, in other words, these layers are formed in the same pattern. This is because these domain control layers and the lead conductor layers are sequentially deposited by using the same photoresist pattern formed by a photolithography process including deposition of a resist film, its exposure and its development.

Recently, the track width of the magnetic head becomes narrower and thus the MR element is required to improve its output performance. In order to satisfy this requirement, a structure called as "lead overlaid structure", in which lead conductor layers are inwardly extended from magnetic domain control layers, in other words, a space between the lead conductor layers is narrower than that of the domain control layers (the actual width of the MR layer) have been proposed (for example, U.S. Pat. No. 6,141,190 and Japanese patent publication Nos. 11031313A, 11224411A and 2000076629A).

U.S. Pat. No. 6,141,190 and Japanese patent publication No. 2000076629A disclose a lead overlaid structure fabricated by executing double photolithography processes. FIGS. 1a to 1f show sectional views seen from an air bearing surface (ABS) of an MR element, illustrating processes for manufacturing this lead overlaid structure.

First, as shown in FIG. 1a, an MR layer 11 is deposited on a shield gap layer 10, and then a first photoresist pattern 12 is formed on the MR layer 11 by performing a first photolithography process.

Then, as shown in FIG. 1b, ion milling using the first photoresist pattern 12 is performed to obtain a patterned MR layer 11', and thereafter a hard magnetic layer 13 for forming magnetic domain control layers is deposited using the same first photoresist pattern 12.

Then, as shown in FIG. 1c, the first photoresist pattern 12 is removed by the lift-off process to obtain patterned magnetic domain control layers 13'.

Then, as shown in FIG. 1d, a second photoresist pattern 14 provided with a width narrower than that of the first photoresist pattern 12 is formed by performing a second photolithography process.

Then, as shown in FIG. 1e, a conductive layer 15 for forming lead conductor layers is deposited using the second photoresist pattern 14.

Thereafter, as shown in FIG. 1f, the second photoresist pattern 14 is removed by the lift-off process to obtain patterned lead conductor layers 15' and thus the lead overlaid structure is obtained.

However, according to this manufacturing method of the lead overlaid structure, since twice of photolithography processes are necessary to perform, the manufacturing processes of the MR element becomes complicated and precise alignment between these photolithography is required.

Japanese patent publication No. 11031313A discloses a method of forming a lead overlaid structure fabricated by executing a single photolithography process. In this method, a sputtering angle for forming magnetic domain control layers and a sputtering angle for forming lead conductor layers are different from each other.

However, according to this manufacturing method of the lead overlaid structure, since the pattern of the lead conductor layers is controlled only by adjusting the sputtering angle, it is quite difficult to precisely control the track width and the amount of overlap (FIG. 1f).

Japanese patent publication No. 11224411A discloses a method of forming a lead overlaid structure fabricated by executing a single photolithography process. In this method, a conductive layer for forming lead conductor layers is deposited by sputtering using a photoresist pattern prepared for forming an MR layer before the MR layer is patterned. Then, the conductive layer is partially removed to form a part of lead conductor layers during the patterning of the MR layer, and thereafter magnetic domain control layers and other part of the lead conductor layers are formed by sputtering using the same photoresist pattern.

However, according to this manufacturing method of the lead overlaid structure, since the lead conductor layers are formed in stages by two sputtering processes, it is difficult to surely connect in a low resistance these parts of the lead conductor layers formed in two steps. Also, since the magnetic domain control layers and the lead conductor layers are patterned using the broad-shouldered photoresist pattern due to side wall deposition, it is difficult to make precise pattern of these layers and thus it is quite difficult to precisely control the amount of overlap.

SUMMARY OF THE INVENTION

It is therefore an object of the present invention to provide a manufacturing method of an MR thin-film magnetic head, whereby the amount of overlap can be precisely controlled without complicating its manufacturing processes.

Another object of the present invention is to provide a novel method for forming a photoresist pattern and a novel manufacturing method of an MR thin-film magnetic head, whereby a photoresist pattern with a narrow width can be easily formed.

According to the present invention, a method for forming a photoresist pattern, includes a step of forming a photoresist pattern having a certain width, and a step of performing thereafter ion milling with respect to side walls of the formed photoresist pattern by using an ion beam with a large incident angle so as to reduce the width of the formed photoresist pattern.

Since the side walls of the photoresist pattern are shaven by ion milling with a large incident angle ion beam, namely with a large milling angle, a photoresist pattern with a narrower width can be easily provided.

It is preferred that the incident angle of the ion beam is an angle larger than 40 degrees and smaller than 90 degrees.

According to the present invention, also, a manufacturing method of an MR thin-film magnetic head, includes a step of depositing a layer for forming magnetic domain control layers by using a photoresist pattern having a certain width, a step of performing thereafter ion milling with respect to side walls of the photoresist pattern by using an ion beam with a large incident angle so as to reduce the width of the photoresist pattern, and a step of depositing a layer for forming lead conductor layers by using the photoresist pattern with the reduced width.

Furthermore, according to the present invention, a manufacturing method of an MR thin-film magnetic head, includes a step of forming a photoresist pattern having a certain width on an MR layer, a step of performing ion milling with respect to the MR layer by using the photoresist pattern to form a patterned MR layer, a step of depositing a layer for forming magnetic domain control layers by using the photoresist pattern, a step of performing thereafter ion milling with respect to side walls of the photoresist pattern by using an ion beam with a large incident angle so as to reduce the width of the photoresist pattern, and a step of depositing a layer for forming lead conductor layers by using the photoresist pattern with the reduced width.

After depositing the layer for forming magnetic domain control layers using a photoresist, the side walls of the photoresist pattern are shaven by the ion milling with the large milling angle to decrease the width of the pattern, and the layer for forming lead conductor layers is deposited using this width-reduced photoresist pattern. Thus, precise control of the overlap amount can be expected with executing only one photolithography process. Namely, it is possible to provide a lead overlaid structure with a precisely controlled amount of overlap without complicating its manufacturing processes.

It is preferred that the incident angle of the ion beam is an angle larger than 40 degrees and smaller than 90 degrees.

Further objects and advantages of the present invention will be apparent from the following description of the preferred embodiments of the invention as illustrated in the accompanying drawings.

DESCRIPTION OF THE PREFERRED EMBODIMENTS

FIGS. 2a to 2e illustrate manufacturing processes of a lead overlaid structure in a preferred embodiment according to the present invention.

Figure 1A:
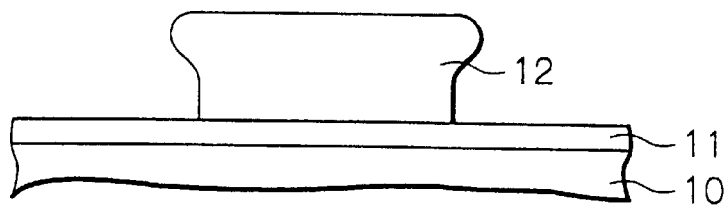
FIGS. 1a to 1f, already described, show sectional views seen from the ABS of the MR element illustrating conventional processes for manufacturing the lead overlaid structure.
Figure 1B:
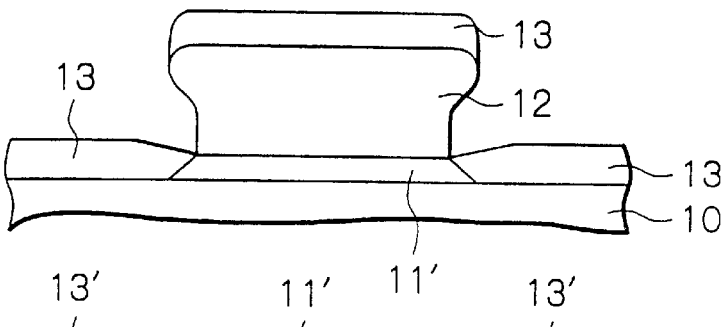
Figure 1C:
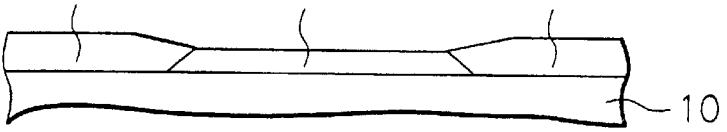
Figure 1D:
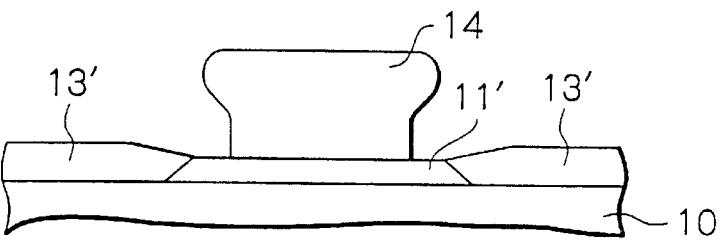
Figure 1E:
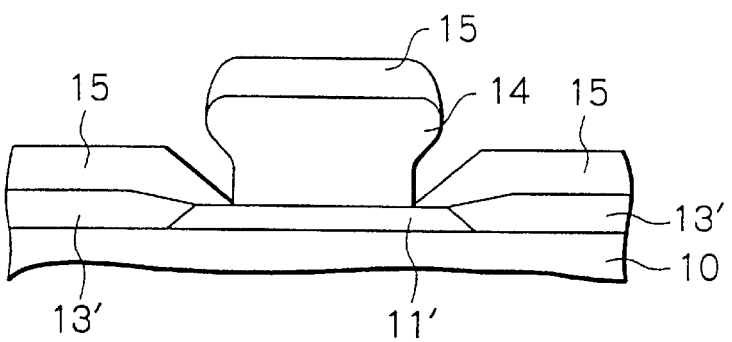
Figure 1F:
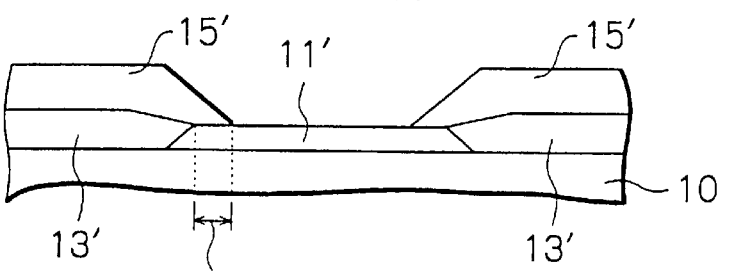
Figure 2A:
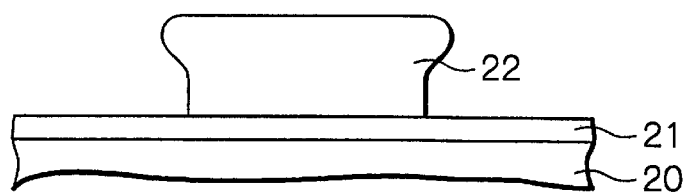
FIGS. 2a to 2e show sectional views seen from the ABS of an MR element illustrating manufacturing processes of a lead overlaid structure in a preferred embodiment according to the present invention.

First, as shown in FIG. 2a, an MR layer 21 is deposited on a shield gap layer 20, and then a photoresist pattern 22 is formed on the MR layer 21 by performing a single photolithography process.

This MR layer 21 may be an AMR layer provided with a single layer structure, or a SVMR or other GMR layer provided with a multi-layered structure of a ferromagnetic thin-film layer (free layer)/a nonmagnetic thin-film metal layer/a ferromagnetic thin-film layer (pinned layer)/an antiferromagnetic thin-film layer laminated in this order or reversed order.

Then, ion milling of the MR layer 21 using the photoresist pattern 22 is performed to obtain a patterned MR layer 21'. In this process, a milling angle or an incident angle of ion beam for milling is 0 degree, namely perpendicular to a laminating plane. Thereafter, a hard magnetic layer 23 for forming magnetic domain control layers is deposited using the same photoresist pattern 22.

Figure 2B:
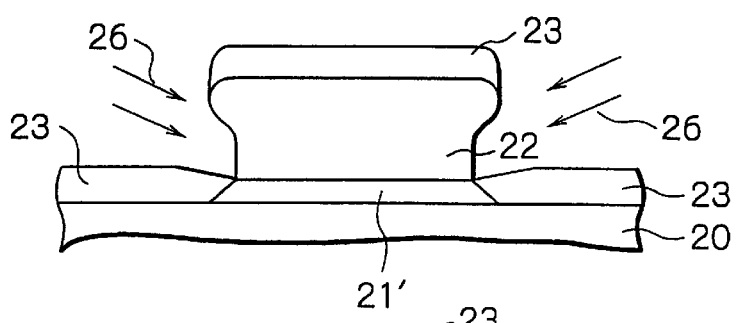
Figure 2C:
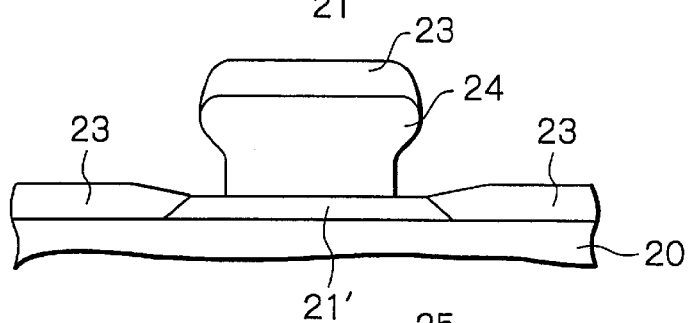

Then, as shown in FIG. 2b, ion milling with a milling angle or an incident angle of ion beam 26 larger than the milling angle for patterning the MR layer 21 is performed to shave side walls of the photoresist pattern 22 on which the hard magnetic layer 23 is deposited. Thus, as shown in FIG. 2c, the side walls of the photoresist pattern 22 and of the hard magnetic layer 23 are shaven and a photoresist pattern 24 with an extremely narrower width than that of the photoresist pattern 22 is provided.

Figure 2D:
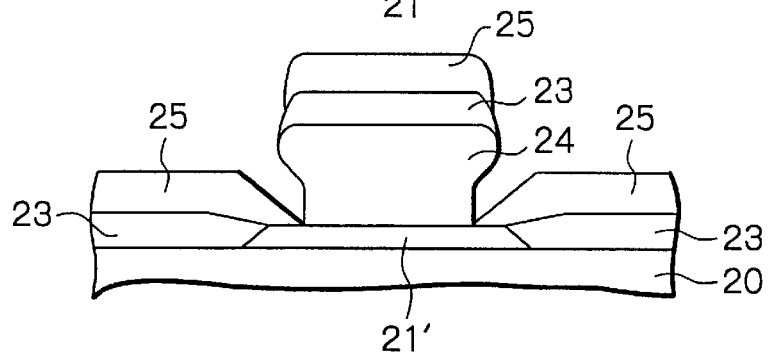

Then, as shown in FIG. 2d, a conductive layer 25 for forming lead conductor layers is deposited using the photoresist pattern 24.

Figure 2E:
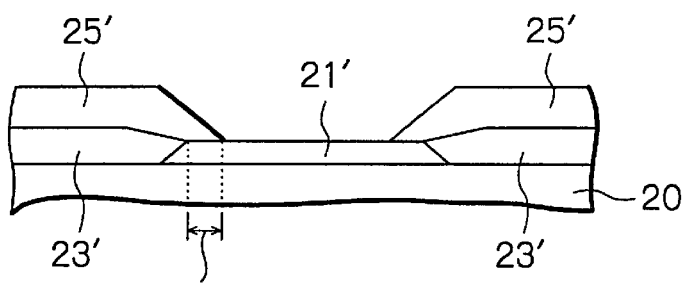

Thereafter, as shown in FIG. 2e, the photoresist pattern 24 is removed by the lift-off process to obtain patterned magnetic domain layers 23' and patterned lead conductor layers 25'.

It is desired that the incident angle of the ion beam 26 for shaving the side walls of the photoresist pattern 22, namely the milling angle (angle of ion beam with respect to the normal of the substrate) is larger than 40 degrees. This is derived from the following measurements.

Various samples were fabricated by performing ion milling of the MR layer 21 with the milling angle of 0 degree to form the patterned MR layer 21', by sputtering magnetic material to form the domain control layers, and by performing ion milling with different milling angles and milling times. Then, overlap amount of each sample was measured by observing from the ABS utilizing transmission electron microscopy (TEM). The measured results are shown in Tables 1 to 4.

TABLE 1

Milling Angle: 30 degrees

| MILLING TIME (seconds) | OVERLAP AMOUNT ($\mu$m) |
|---|---|
| 100 | 0.00 |
| 200 | 0.00 |
| 300 | 0.02 |

TABLE 2

Milling Angle: 40 degrees

| MILLING TIME (seconds) | OVERLAP AMOUNT ($\mu$m) |
|---|---|
| 100 | 0.02 |
| 200 | 0.06 |
| 300 | 0.09 |

TABLE 3

Milling Angle: 60 degrees

| MILLING TIME (seconds) | OVERLAP AMOUNT ($\mu$m) |
|---|---|
| 100 | 0.05 |
| 200 | 0.09 |
| 300 | 0.14 |

TABLE 4

Milling Angle: 80 degrees

| MILLING TIME (seconds) | OVERLAP AMOUNT ($\mu$m) |
|---|---|
| 100 | 0.08 |
| 200 | 0.12 |
| 300 | 0.17 |

Figure 3:
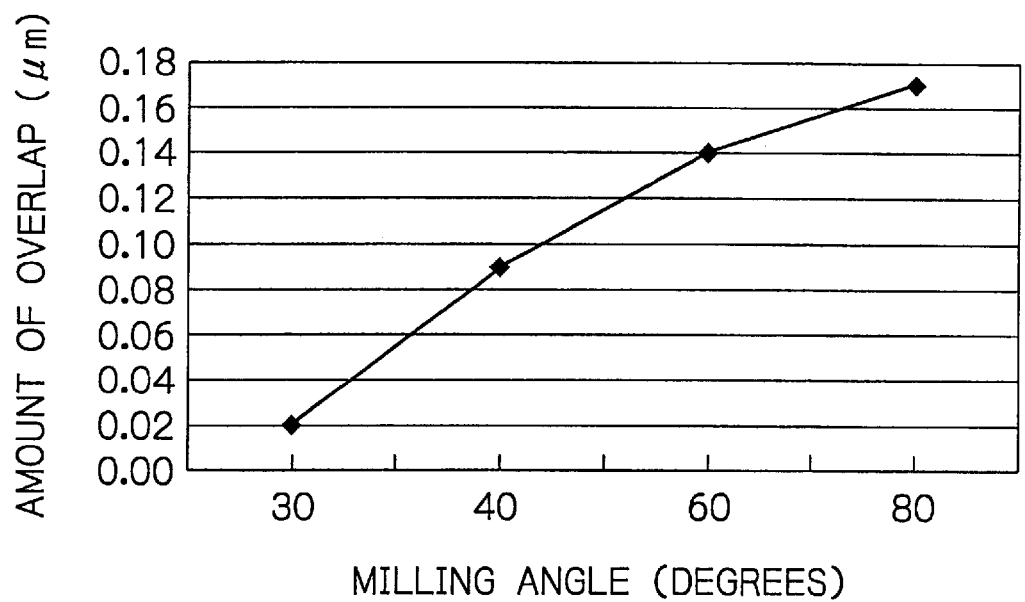
FIG. 3 shows a characteristic view illustrating change in overlap amount with respect to a milling angle.

FIG. 3 illustrates change in the measured overlap amount with respect to the milling angle when the milling time is kept at 300 seconds.

In general, required is to have an overlap amount of about 0.1 $\mu$m or more in the lead overlaid structure. In order to obtain such overlap amount without spending milling time not so much, as will be apparent from FIG. 3 and Tables 1 to 4, it is necessary to keep the milling angle over 40 degrees. If the milling angle is kept at 40 degrees or less, for example at about 30 degrees, the photoresist pattern can hardly be shaven but the layer laminated thereon will be shaven.

The upper limit of the milling angle is in theory less than 90 degrees. If the milling angle is 90 degrees, no shaving by the milling will be produced. However, with the ion milling equipment which the inventors is using now, the milling angle of about 80 degrees is maximum.

As aforementioned, according to this embodiment, the side walls of the photoresist pattern 22 are shaven by the ion milling with the milling angle over 40 degrees to decrease the width of the pattern 22, and the layer 25 for forming lead conductor layers is deposited using the photoresist pattern 24 with the reduced width. Thus, precise control of the overlap amount can be expected with executing only one photolithography process. Namely, it is possible to provide a lead overlaid structure with a precisely controlled amount of overlap without complicating its manufacturing processes.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming a photoresist pattern, comprising the steps of:

forming a photoresist pattern having a certain width; and thereafter, performing ion milling with respect to side walls of said formed photoresist pattern by using an ion beam with a large incident angle so as to reduce the width of said formed photoresist pattern, wherein said incident angle of the ion beam is an angle larger than 40 degrees and smaller than 90 degrees.

2. A manufacturing method of a magnetoresistive effect thin-film magnetic head, comprising the steps of:

depositing a layer for forming magnetic domain control layers by using a photoresist pattern having a certain width;

thereafter, performing ion milling with respect to side walls of said photoresist pattern by using an ion beam with a large incident angle so as to reduce the width of said photoresist pattern; and depositing a layer for forming lead conductor layers by using said photoresist pattern with the reduced width.

3. The manufacturing method as claimed in claim 2, wherein said incident angle of the ion beam is c=an angle larger than 40 degrees and smaller than 90 degrees.

4. A maufacturing method of a magnetoresistive effect thin-film magnetic head, comprising the steps of:

forming a photoresist pattern having a certain width on a magnetoresistive effect layer;

performing ion milling with respect to said magnetoresistive effect layer by using said photoresist pattern to form a patterned magnetoresistive effect layer;

depositing a layer for forming magnetic domain control layers by using said photoresist pattern;

thereafter, performing ion milling with respect to side walls of said photoresist pattern by using an ion beam with a large incident angle so as to reduce the width of said photoresist pattern; and depositing a layer for forming lead conductor layers by using said photoresist pattern with the reduced width.

5. The manufacturing method as claimed in claim 4, wherein said incident angle of the ion beam is an angle larger than 40 degrees and smaller than 90 degrees.

* * * * *